(12) United States Patent
Tsai

(10) Patent No.: US 8,004,245 B2
(45) Date of Patent: Aug. 23, 2011

(54) TEST DEVICE FOR TESTING CHARGE PERFORMANCE OF ELECTRONIC DEVICE

(75) Inventor: Han-I Tsai, Taipei County (TW)

(73) Assignee: Chi Mei Communication Systems, Inc., Tu-Cheng, New Taipei (TW)

( * ) Notice: Subject to any disclaimer, the term of this patent is extended or adjusted under 35 U.S.C. 154(b) by 630 days.

(21) Appl. No.: 12/191,391

(22) Filed: Aug. 14, 2008

(65) Prior Publication Data
US 2009/0189563 A1 Jul. 30, 2009

(30) Foreign Application Priority Data
Jan. 30, 2008 (CN) .......................... 2008 1 0300271

(51) Int. Cl.
*H02J 7/00* (2006.01)
(52) U.S. Cl. ........................ 320/134; 320/107
(58) Field of Classification Search .......... 320/134–136, 320/107; 361/91.1, 91.2, 90
See application file for complete search history.

(56) References Cited

U.S. PATENT DOCUMENTS
6,507,172 B2 * 1/2003 Sherman ....................... 320/134
* cited by examiner

*Primary Examiner* — Edward Tso
*Assistant Examiner* — Samuel Berhanu
(74) *Attorney, Agent, or Firm* — Altis Law Group, Inc.

(57) ABSTRACT

A test device (100) for charge performance of an electronic device (60) that including a battery port (61) and a charge port (62), which includes a first switch (10), a second switch (20), a reset chip (40) and a control unit (50). The second switch is connected to the first switch and both the battery port and charge port. The first switch generates a charge voltage and input it to the charge port. The second switch obtains a voltage on the battery port and sends it to the reset chip. The reset chip includes an input end connected to the second switch and a RESET pin connected to the first switch. The reset chip adjudges if the RESET pin should generating a reset signal to the first switch according to the voltage on the battery port.

11 Claims, 2 Drawing Sheets

TEST DEVICE FOR TESTING CHARGE PERFORMANCE OF ELECTRONIC DEVICE

BACKGROUND

1. Field of the Invention

The present invention generally relates to test devices, and particularly to a test device for testing the charge performance of electronic devices.

2. Description of Related Art

With the development of wireless communication and information processing technologies, electronic devices, such as laptops, mobile phones and personal digital assistants (PDAs), are now in widespread use. The batteries of the electronic devices are usually rechargeable. Before products leave the factory, the charge performance of electronic devices needs to be tested to ensure the quality of the electronic devices.

However, when testing the charge performance, an electronic device may be damaged if the test voltage is too high.

Therefore, a new test device for testing charge performance of electronic device having a function of over-voltage protection is desirable to overcome the above-described problems.

BRIEF DESCRIPTION OF THE DRAWINGS

Many aspects of the test device for charge performance of electronic device can be better understood with reference to the following drawings. Drawings are not necessarily drawn to scale, the emphasis instead being placed upon clearly illustrating the principles of the present test device. Moreover, in the drawings, like reference numerals designate corresponding parts throughout the several views, in which.

DETAILED DESCRIPTION OF THE EMBODIMENTS

Figure 1:
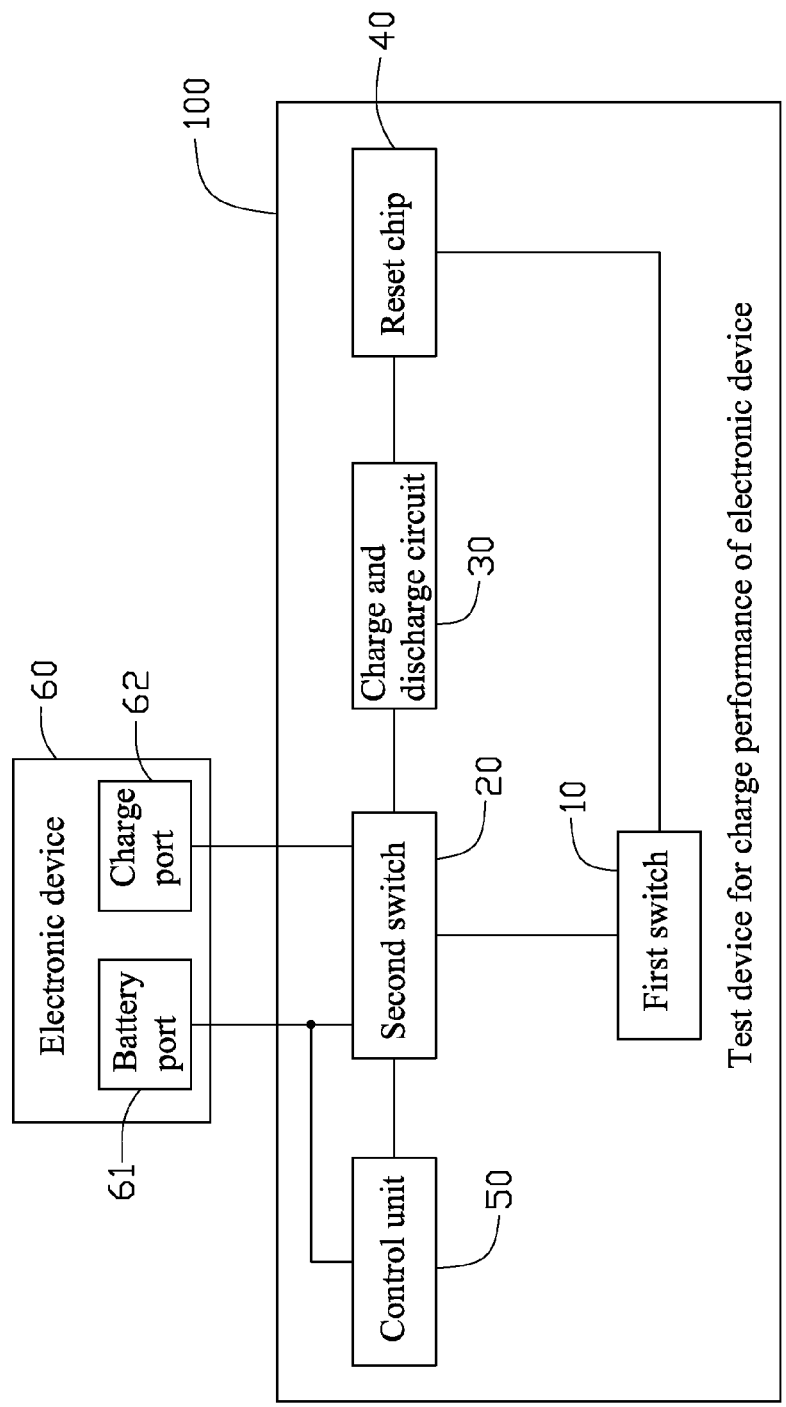
FIG. 1 is a block diagram of a test device for testing charge performance of an electronic device according to an exemplary embodiment of the invention.
Figure 2:
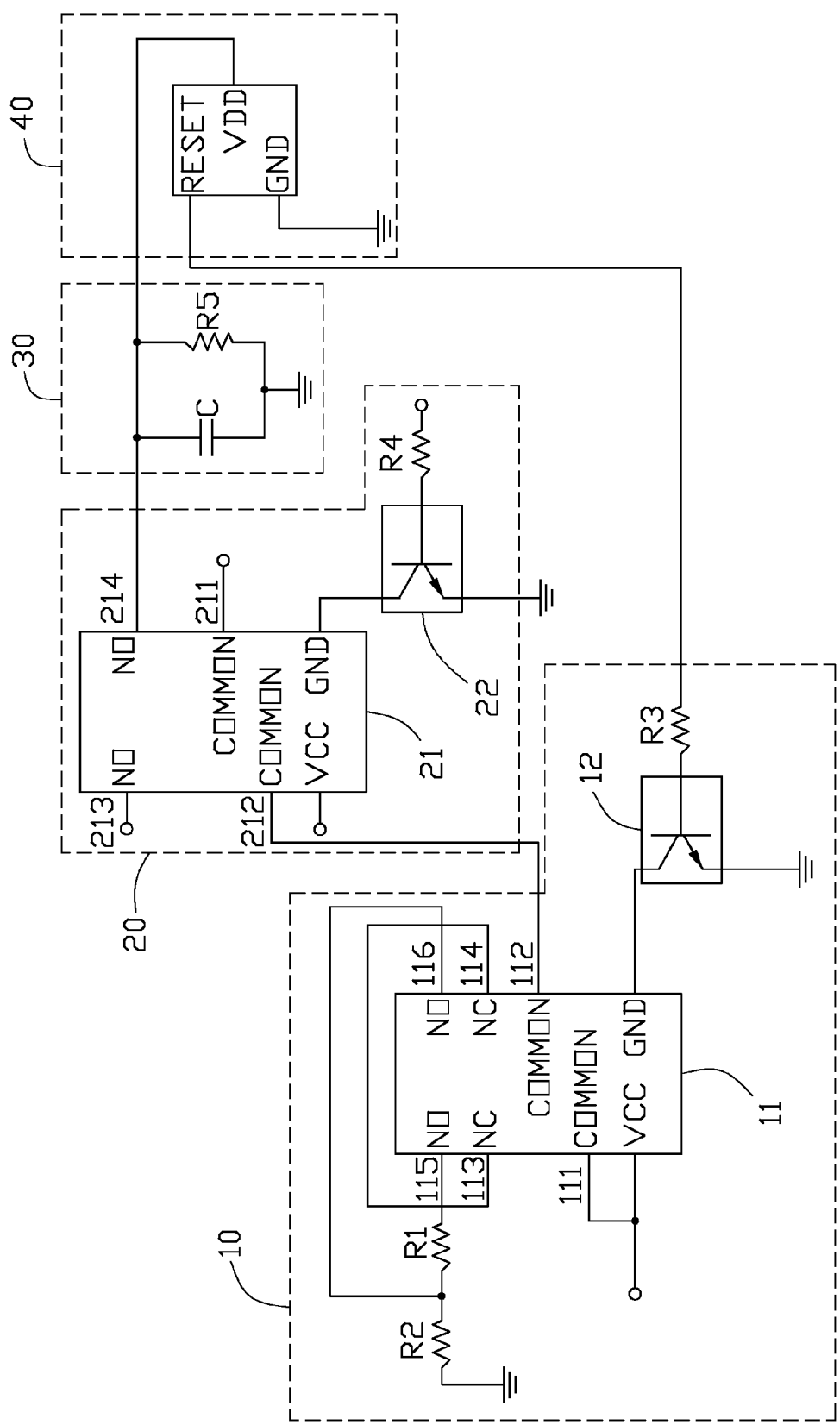
FIG. 2 is a partial circuit diagram of a test device for testing charge performance of electronic device shown in FIG. 1.

Referring to FIGS. 1 and 2, a test device 100 for testing the charge performance of an electronic device 60 is provided. The electronic device can be a mobile phone, a personal digital assistant (PDA) and so on. The electronic device 60 includes a battery port 61 and a charge port 62.

The test device 100 includes a first switch 10, a second switch 20, a charge and discharge circuit 30, a reset chip 40 and a control unit 50. The first switch 10, the second switch 20, the charge and discharge circuit 30, and the reset chip 40 are electronically connected in series and forming a loop. The control unit 50 is electronically connected to both the second switch 20 and the battery port 61 of the electronic device 60. Both the battery port 61 and the charge port 62 of the electronic device 60 are electronically connected to the second switch 20. The first switch 10 is used for switching a charge voltage of the electronic device 60 and providing the voltage to the electronic device 60 through the second switch 20 and generating an alarming signal when the test is completed. The second switch 20 is used for controlling the charge for the electronic device 60 according to a control signal received from the control unit 50. The charge and discharge circuit 30 is used for charging and discharging according to the change of the voltage on the battery port 61 through the second switch 20, so as to protect the reset chip 40 from being damaged by too high a voltage or too low a voltage.

The control unit 50 is used for determining whether the charge performance of the electronic device 60 is normal and sending a test start/stop control signal. An exemplary control signal for starting a test is a high-level control signal, and an exemplary control signal for stopping a test is a low-level control signal. The control unit 50 can be a computer or a single chip micyoco (SCM).

Referring to FIG. 2, the first switch 10 includes a first relay 11, a first resistor R1, a second resistor R2, a first transistor 12, a third resistor R3. The first relay 11 includes a Vcc pin connecting to a working voltage, a Grounded GND pin, a first COMMON pin 111, a second COMMON pin 112, a first NC (normally closed) pin 113, a second NC pin 114, a first NO (normally open) pin 115 and a second NO pin 116.

The Vcc pin is electronically connected to the first COMMON pin 111. The GND pin is electronically connected to a collector of the first transistor 12 and is grounded through an emitter of the first transistor 12. The second COMMON pin 112 is connected to the second switch 20. The first NC pin 113 is connected to the second NC pin 114. The first NO pin 115 is grounded through the first resistor R1 and the second resistor R2. The second NO pin 116 is connected between the first resistor R1 and the second resistor R2. The first resistor R1 and the second resistor R2 are used as a voltage divider. One end of the third resistor R3 is connected to a base of the first transistor 12, and the other end of the third resistor R3 is connected to the reset chip 40 for receiving a reset signal from the reset chip 40.

The first relay 11 can switch from a first mode to a second mode according to the reset signal received from the reset chip 40. In the first mode, a current flows from the first COMMON pin 111 to the first NC pin 113, and then to the second COMMON pin 112 through the second NC pin 114. An output of the second COMMON pin 112 is the work voltage.

When the first switch 10 receives a reset signal from the reset chip 40, the first relay 11 is switched to a second mode from the first mode. The current flows from the first COMMON pin 111 to the first NO pin 115, and then to the second COMMON pin 112 through the second NO pin 116. An output voltage of the second COMMON pin 112 is equal to a voltage of the second resistor R2. The output voltage of the second COMMON pin 112 can be adjusted by changing the ratio of the first resistor R1 and the second resistor R2, that is, the value of R1/R2. In the second mode, the output voltage of the second COMMON pin 112 is lower than an over-voltage of the electronic device 60.

The second switch 20 includes a second relay 21, a second resistor 22 and a fourth resistor R4. The second relay 21 includes a Vcc pin connecting to a working voltage, a Grounded GND pin, a third COMMON pin 211, a fourth COMMON pin 212, a third NO pin 213 and a fourth NO pin 214. The Vcc pin is electronically connected to a work voltage of the second relay 21. The GND pin is electronically connected to a collector of the second transistor 22 and is grounded through an emitter of the second transistor 22. The third COMMON pin 211 is connected to the battery port 61 of the electronic device 60. The fourth COMMON pin 212 is connected to the second COMMON pin 112. The third NO pin 213 is connected to the charge port 62 of the electronic device 60. One end of the fourth resistor R4 is connected to a base of the second transistor 22, and the other end of the fourth resistor R4 is connected to the control unit 50 for starting or stopping the test according to a control signal received from the control unit 50.

When the second switch 20 receives a control signal for starting the test, the second relay 21 is activated for charging the electronic device 60. A charge current flows from the second COMMON pin 112 to the fourth COMMON pin 212, and then to the charge port 62 of the electronic device 60 through the third NO pin 213. The charge current in the electronic device 60 flows to the battery port 61 through a charge circuit (not shown) of the electronic device 60, and then to the fourth NO pin 214 through the third COMMON pin 211. That is, the output voltage of the second COMMON pin 112 is a charge voltage on the charge port 62 of the electronic device 60. The output voltage of the fourth COMMON pin 212 is the equal to the voltage on the battery port 61 of electronic device 60.

The charge and discharge circuit 30 is connected to the fourth NO port 214. The charge and discharge circuit 30 includes a capacitor C and a fifth resistor R5. The capacitor C and the fifth resistor R5 are connected in parallel and grounded. When the second relay 21 is activated, the voltage on the fourth NO pin 214 is provided to the capacitor C. Accordingly, the capacitor C charges or discharges according to the change of the voltage of the battery port 61.

The reset chip 40 includes a $V_{DD}$ pin as an input port, a RESET pin and a grounded GND pin. The $V_{DD}$ pin is connected to the fourth NO pin 214. The RESET pin is connected to the third R3. A threshold voltage of the reset chip 40 is lower than the over-voltage of the electronic device 60. An exemplary threshold voltage of the reset chip 40 is 4V. When the voltage input on the $V_{DD}$ pin of the reset chip 40 is larger than the threshold voltage of 4V, the RESET pin of the reset chip 40 sends a reset signal to the first switch 10 for switching the first relay 11 to the second mode thereof. Then, the output voltage of the first switch 10 is changed to be lower than the over-voltage of the electronic device 60, for preventing the electronic device 60 from being damaged by high voltage. An exemplary reset signal is a high-level reset signal.

In test, the Vcc pin of the first relay 11 and the Vcc pin of the second relay 21 are respectively provided with a work voltage. The battery port 61 of the electronic device 60 is connected to the control unit 50 and the third COMMON pin 211. The charge port 62 is connected to the third NO pin 214. A control signal for starting a test is input by the control unit 50, and then a high-level control signal is sent to the second switch 20. A current is amplified by the second transistor 22 and then triggers the second relay 21 to start the charge of the electronic device 60.

The charge current flows from the first COMMON pin 111 to the second COMMON pin 112 through the first NC pin 113 and the second NC pin 114, and then into the charge port 62 of the electronic device 60 through the fourth COMMON pin 212 and the third NO pin 213. The current further flows to the battery port 61 through the charge circuit of the electronic device, for charging the battery of the electronic device 60. Then, the current flows form the battery port 61 to the $V_{DD}$ pin of the reset chip 40 through the third COMMON pin 211 and the fourth NO pin 214. The reset chip 40 obtains the voltage on the battery port 61 of the electronic device 60, and determines whether to send a reset signal by comparing the voltage on the battery port 61 with the threshold voltage of the reset chip 40.

When charging, the control unit 50 requests the value of the charge current in the charge port 62. The electronic device 60 may have a responding function, the electronic device 60 should response the value of the charge current to the control unit 50. The control unit 50 judges whether the charge was successful according to the responding charge current.

If the charge was unsuccessful, the control unit 50 sends a control signal for stopping the test to the second switch 20 to stop the test, and the test result of the charge performance of the electronic device 60 is indicated as abnormal. If the charge succeeds, the electronic device 60 is charged until the voltage on the battery port 61 reaches or exceeds the threshold voltage. Then the reset chip 40 sends a reset signal to the first switch 10 for switching the first relay 11 into the second mode, to change the output voltage of the first switch 10 to be lower than the over-voltage of the electronic device 60. At the same time, the first switch 10 generates an alarming signal to indicate that the charge has succeed, and the test result of the charge performance of the electronic device 60 is normal. In the present embodiment, the first switch 10 does not generates an alarming signal without receiving a rest signal from the reset chip 40.

It should be understood that, the first transistor 12 and the second transistor 22 can be replaced by another amplifying elements, such as field-effect transistors (FETs). In addition, the charge and discharge circuit 30 can be omitted, and the RESET pin is only connected to the fourth NO pin 214.

A main advantage of the test device 100 for charge performance of electronic device is that it prevents the tested electronic device 60 from being damaged in the test by maintaining the charge voltage lower than the over voltage of the electronic device 60.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A device for testing the charge performance of an electronic device including a battery port and a charge port, the test device comprising:
    a first switch used for generating a charge voltage;
    a second switch electronically connected to the first switch and both the battery port and charge port of the electronic device, the charge voltage being input to the charge port through the second switch, and the second switch obtaining a voltage of the battery port;
    a reset chip comprising an input end connected to the second switch, and a RESET pin connected to the first switch, the reset chip receiving the voltage of the battery port from the second switch and determining if the RESET pin should generating a reset signal to the first switch according to the voltage on the battery port, if a reset signal is generated, the reset signal being sent to the first switch for triggering the first switch to switch the charge voltage and generate an alarming signal; and
    a control unit electronically connected to both the second switch and the battery port of the electronic device, the control unit being used for determining if the charge performance of the electronic device is normal and sending a control signal to the second switch for starting a test or sending a control signal for stopping a test.

2. The test device of claim 1, wherein the first switch comprises a first relay, a first resistor, a second resistor and a first transistor, the first relay including a Vcc pin for being connected to the input voltage of the first switch, a GND pin for receiving a reset signal from the reset chip, a first COMMON pin connected to the Vcc pin, a second COMMON pin connected to the second switch, a first NC pin, a second NC pin connected to the first NC pin, a first NO pin grounded through the first resistor and the second resistor, and a second NO pin connected between the first resistor and the second resistor.

3. The test device of claim 2, wherein the first relay is switched from a first mode to a second mode according to the reset signal received from the reset chip, and in the first mode, the output voltage of the first relay is the work voltage of the first relay, in the second mode the output voltage of the first relay is equal to a voltage on the second resistor and lower than an over-voltage of the electronic device.

4. The test device of claim 3, wherein the output voltage of the second COMMON pin can be adjusted by changing the ratio of the first resistor and the second resistor.

5. The test device of claim 2, wherein the first switch further comprises a amplifying element and a third resistor connected to the GND pin of the first relay in series, the Grounded GND pin through amplifying element, the third resistor being connected to the RESET pin of the reset chip.

6. The test device of claim 1, wherein the second switch comprises a second relay including a Vcc pin for inputting a work voltage of the second relay, a GND pin, a third COMMON pin for being connected to the battery port of the electronic device, a fourth COMMON pin connected to the second COMMON pin of the first relay, a third NO pin for being connected to the charge port of the electronic device, and a fourth NO pin connected the input end of the reset chip.

7. The test device of claim 6, the second switch further comprises an amplifying element and a fourth resistor connected to the GND pin of the first relay in series, the Grounded GND pin through amplifying element.

8. The test device of claim 7, wherein the control unit connected to both the fourth resistor of the second switch and the battery port of the electronic device.

9. The test device of claim 1, wherein the reset chip has a threshold voltage of the reset chip is lower than the over-voltage of the electronic device, and when the voltage input on the reset chip is larger than the threshold voltage, a reset signal is send from the RESET pin of the reset chip to the first switch.

10. The test device of claim 1, further comprising a control unit connected to both the second switch and the battery port of the electronic device, the control unit being used for judging if the charge performance of the electronic device is normal and sending a control signal for starting a test or a control signal for stopping a test.

11. The test device of claim 1, further comprising a charge and discharge circuit connected to the second relay, the charge and discharge circuit including a capacitor and a fifth resistor that are connected in parallel and then grounded.

* * * * *